(12) United States Patent
Park

(10) Patent No.: US 7,995,404 B2
(45) Date of Patent: Aug. 9, 2011

(54) SEMICONDUCTOR IC DEVICE AND DATA OUTPUT METHOD OF THE SAME

(75) Inventor: Nak-Kyu Park, Ichon (KR)

(73) Assignee: Hynix Semiconductor Inc. (KR)

( * ) Notice: Subject to any disclaimer, the term of this patent is extended or adjusted under 35 U.S.C. 154(b) by 192 days.

(21) Appl. No.: 12/347,195

(22) Filed: Dec. 31, 2008

(65) Prior Publication Data

US 2010/0019814 A1   Jan. 28, 2010

(30) Foreign Application Priority Data

Jul. 28, 2008   (KR) .......................... 10-2008-0073561

(51) Int. Cl.
*G11C 7/00*   (2006.01)
(52) U.S. Cl. .................... 365/189.15; 365/191; 365/193; 365/233.1
(58) Field of Classification Search ........... 365/189.011, 365/189.15, 191, 193, 233.1
See application file for complete search history.

(56) References Cited

U.S. PATENT DOCUMENTS

| 6,337,809 | B1 | 1/2002 | Kim et al. |
| 6,754,126 | B2 * | 6/2004 | Yamaguchi et al. .......... 365/222 |
| 7,542,358 | B2 * | 6/2009 | Jang ............................ 365/194 |
| 2007/0008787 | A1 | 1/2007 | Oh et al. |

FOREIGN PATENT DOCUMENTS

| KR | 1020020002658 A | 1/2002 |
| KR | 1020040002269 A | 1/2004 |

* cited by examiner

*Primary Examiner* — VanThu Nguyen
(74) *Attorney, Agent, or Firm* — Baker & McKenzie LLP

(57) ABSTRACT

A semiconductor IC device includes a core strobe signal generator configured to latch a read command signal according to an internal clock signal to generate a core strobe signal, a core block configured to output data stored in a memory cell in response to the core strobe signal, a data output unit configured to latch data output from the core block according to a plurality of control signals and output the latched data in a predetermined order, and a controller configured to generate the plurality of control signals by using both the core strobe signal and the internal clock signal.

17 Claims, 8 Drawing Sheets

193

194

SEMICONDUCTOR IC DEVICE AND DATA OUTPUT METHOD OF THE SAME

CROSS-REFERENCES TO RELATED APPLICATION

The present application claims priority under 35 U.S.C. §119(a) to Korean application number 10-2008-0073561, filed on Jul. 28, 2008, in the Korean Intellectual Property Office, which is incorporated herein by reference in its entirety as set forth in full.

BACKGROUND

1. Technical Field

The embodiments described herein relate to a semiconductor integrated circuit (IC) device, and more particularly, to a semiconductor IC device and a data output method of the same.

2. Related Art

FIG. 1 is a schematic block diagram of a conventional semiconductor IC device. In FIG. 1, a semiconductor IC device includes an internal clock generator 11, a Delayed Locked Loop (DLL) 12, a flip-flop 13, a core block 14, an input/output sense amplifier IOSA 15, a pipe latch 16, a data selector 17, a domain crossing block 18, and a read controller 19. Here, the semiconductor IC device can be classified as being one of an internal clock domain, i.e., a circuit area operating according to an internal clock signal 'INT_CLK', and one of a DLL clock domain, i.e., a circuit area operating according to a DLL clock signal 'DLL_CLK'.

The internal clock domain includes a flip-flop 13, a core block 14, and an IOSA 15. The DLL clock domain includes a pipe latch 16, a data selector 17, and a read controller 19. The internal clock generator 11 generates an internal clock signal 'INT_CLK' by using an external clock signal 'EXT_CLK', and generates a DLL clock signal 'DLL_CLK' by using the external clock signal 'EXT_CLK'.

The domain crossing block 18 performs an operation to transform a control operation according to a timing of the internal clock signal 'INT_CLK' to that according to a timing of the DLL clock signal 'DLL_CLK'. According to the DLL clock signal 'DLL_CLK', the read controller 19 generates various control signals, such as 'PINZ<0:N>', 'PROUT<0:N>', 'RDOUT', 'FDOUT', 'RCLK_DO', and 'FCLK_DO', to control the pipe latch 16 and the data selector 17. According to the various control signals, such as 'PINZ<0:N>', 'PROUT<0:N>', 'RDOUT', 'FDOUT', 'RCLK_DO', and 'FCLK_DO', both the pipe latch 16 and the data selector 17 line up parallel data output from the core block 14 and output them in a predetermined order.

In order to synchronize data with a CAS latency and an external clock signal according to an external read command, applications, up to now, have used a DLL clock signal. However, various applications now require output data as soon as possible after an external read command. Thus, in order to meet the requirement of producing data as soon as possible after an external read command, current semiconductor IC devices have problems of greatly modifying circuit structures to meet the requirement that are complicated and occupy large lay-out areas, such as a DLL 12, a domain crossing block 18, and a read controller 19, for controlling both a pipe latch 16 and a data selector 17 according to a DLL clock signal.

SUMMARY

A semiconductor IC device capable of producing data according to an external read command and a data output method of the same are described herein.

In one aspect, a semiconductor IC device includes a core strobe signal generator configured to latch a read command signal according to an internal clock signal to generate a core strobe signal, a core block configured to output data stored in a memory cell in response to the core strobe signal, a data output unit configured to latch data output from the core block according to a plurality of control signals and output the latched data in a predetermined order, and a controller configured to generate the plurality of control signals by using both the core strobe signal and the internal clock signal.

In another aspect, a data output method of a semiconductor IC device includes generating a plurality of control signals to line up and output data stored in a memory cell with reference to an internal signal generated first after a read command signal, and transforming parallel data output from a memory cell to serial data in a predetermined order by using the plurality of control signals and to output them.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 1:
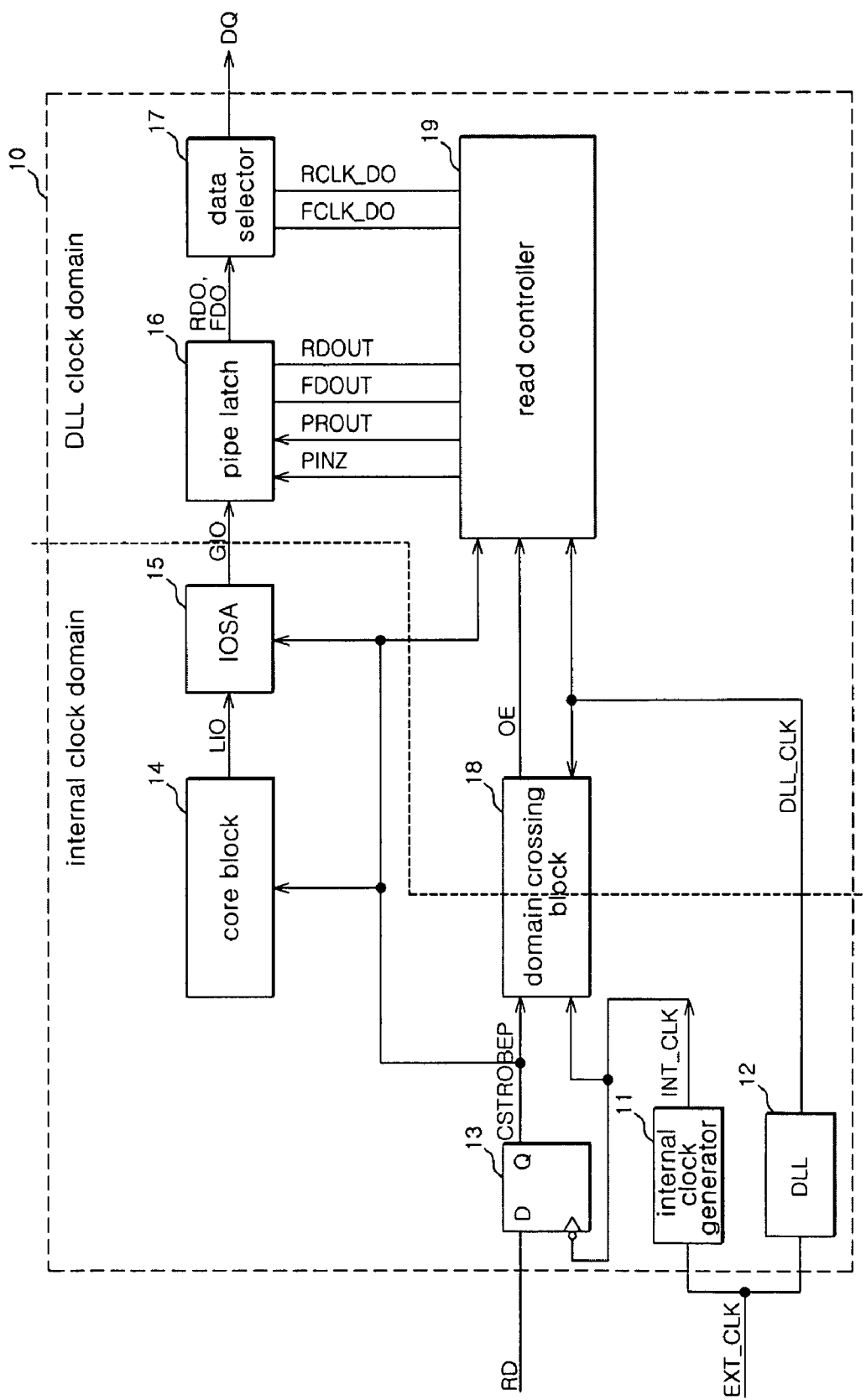
FIG. 1 is a schematic block diagram of a conventional semiconductor IC device.
Figure 2:
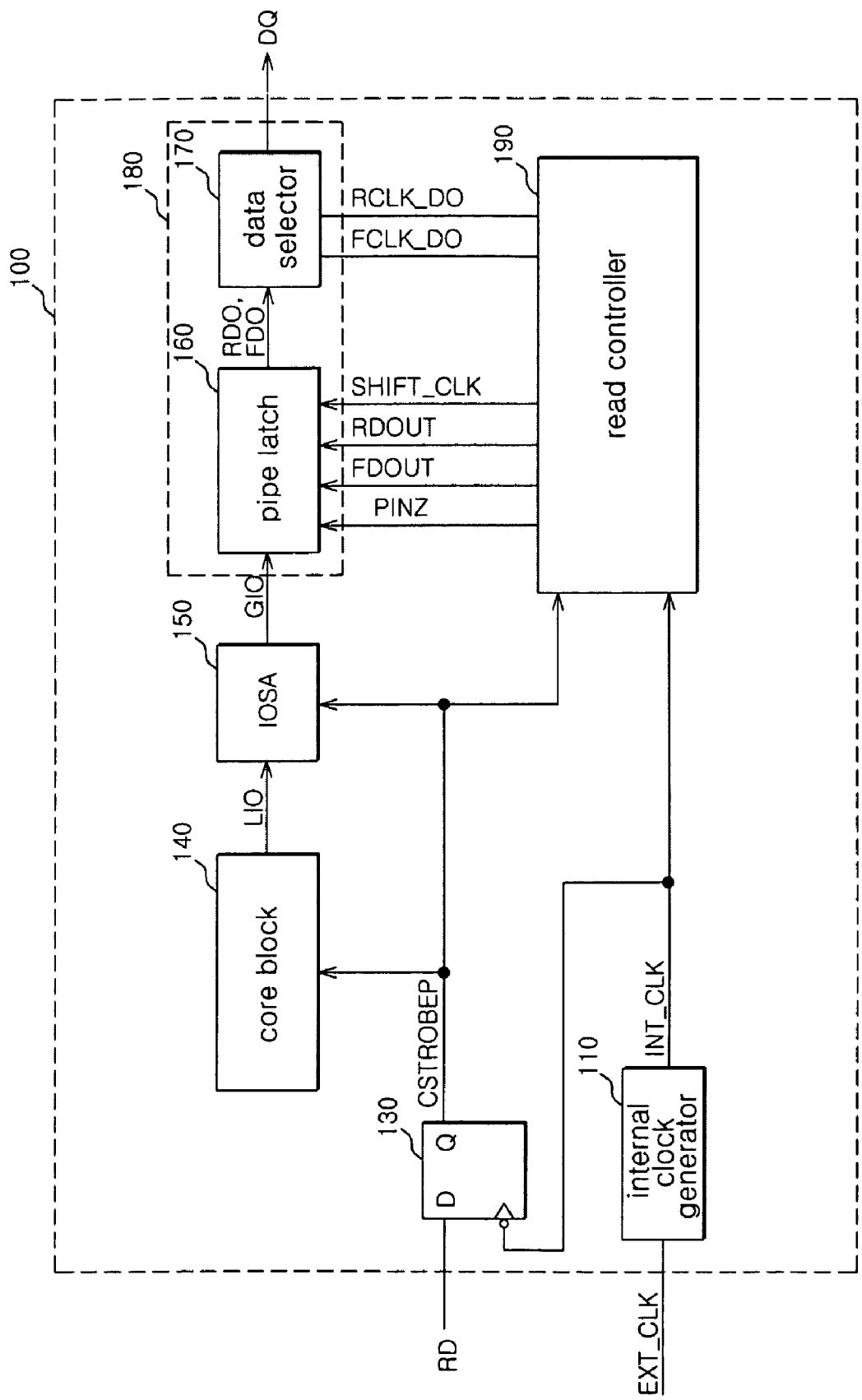
FIG. 2 is a schematic block diagram of an exemplary semiconductor IC device according to one embodiment.

FIG. 2 is a schematic block diagram of an exemplary semiconductor IC device according to one embodiment. In FIG. 2, a semiconductor IC device can be configured to include an internal clock generator 110, a core strobe signal generator 130, a core block 140, an input/output sense amplifier IOSA 150, a data output unit 180, and a read controller 190.

The internal clock generator 110 can be structured to buffer an external clock signal 'EXT_CLK' to generate an internal clock signal 'INT_CLK'.

The core strobe signal generator 130 can be configured to latch a read command signal 'RD' according to the internal clock signal 'INT_CLK' to generate a core strobe signal 'CSTROBEP'.

The core block 140 can be configured to output data stored in a memory cell in response to the core strobe signal 'CSTROBEP'.

The data output unit 180 can be configured to latch data, which can be output from the core block 140, according to a plurality of control signals and can output the latched data in a predetermined order. For example, the data output unit 180 can include a pipe latch 160 and a data selector 170.

The read controller 190 can be configured to generate the plurality of control signals by using both the core strobe signal 'CSTROBEP' and the internal 'clock INT_CLK'. For example, the core strobe signal 'CSTROBEP' can be an internal signal having the fastest timing among internal signals generated responsive to an external read command signal. Thus, the read controller 190 can generate the plurality of control signals with reference to the core strobe signal 'CSTROBEP' in order to output data in the fastest time after an external read command signal.

The plurality of control signals can include a data latch signal 'PINZ', a data shift clock signal 'SHIFT_CLK', data selection signals 'RDOUT' and 'FDOUT', and data output clock signals 'RCLK_DO' and 'FCLK_DO'.

Figure 3:
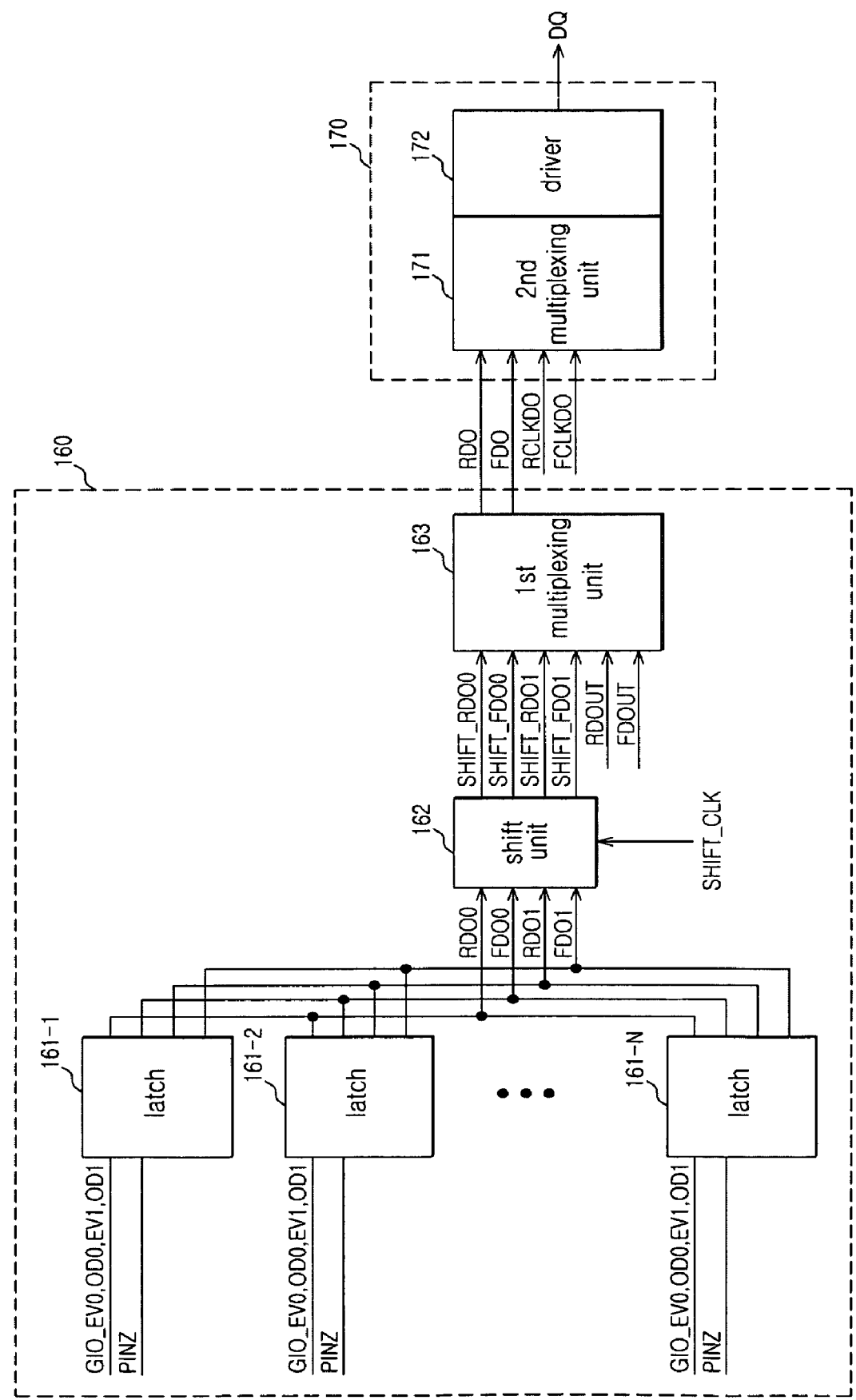
FIG. 3 is a schematic block diagram of an exemplary pipe latch and data selector capable of being implemented in the device of FIG. 2 according to one embodiment.

FIG. 3 is a schematic block diagram of an exemplary pipe latch and data selector capable of being implemented in the device of FIG. 2 according to one embodiment. In FIG. 3, the pipe latch 160 can include a plurality of latches 161-1 to 161-N, a shift unit 162, and a first multiplexing unit 163. According to the data latch signal 'PINZ', the plurality of latches 161-1 to 161-N can latch parallel data signals 'GIO_EV0', 'OD0', 'EV1', and 'OD1' transmitted from the input/output sense amplifier IOSA 150 to a wide data line GIO.

According to the data shift clock signal 'SHIFT_CLK', the shift unit 162 can shift latch data signals 'RDO0', 'FDO0', 'RDO1', and 'FDO1' output from the plurality of latches 161-1 to 161-N. Here, the shift unit 162 can include latches.

According to the data selection signals 'RDOUT' and 'FDOUT', the first multiplexing unit 163 can selectively output shift data signals 'SHIFT_RDO0', 'SHIFT_FDO0', 'SHIFT_RDO1', and 'SHIFT_FDO1' output from the shift unit 162.

The data selector 170 can include a second multiplexing unit 171 and a driver 172. According to the data output clock signals 'RCLK_DO' and 'FCLK_DO', the second multiplexing unit 171 can selectively output data signals 'RDO' and 'FDO' output from the first multiplexing unit 163. In addition, the driver 172 can drive an output of the second multiplexing unit 171, and can produce the output to a data input/output pad DQ.

Figure 4:
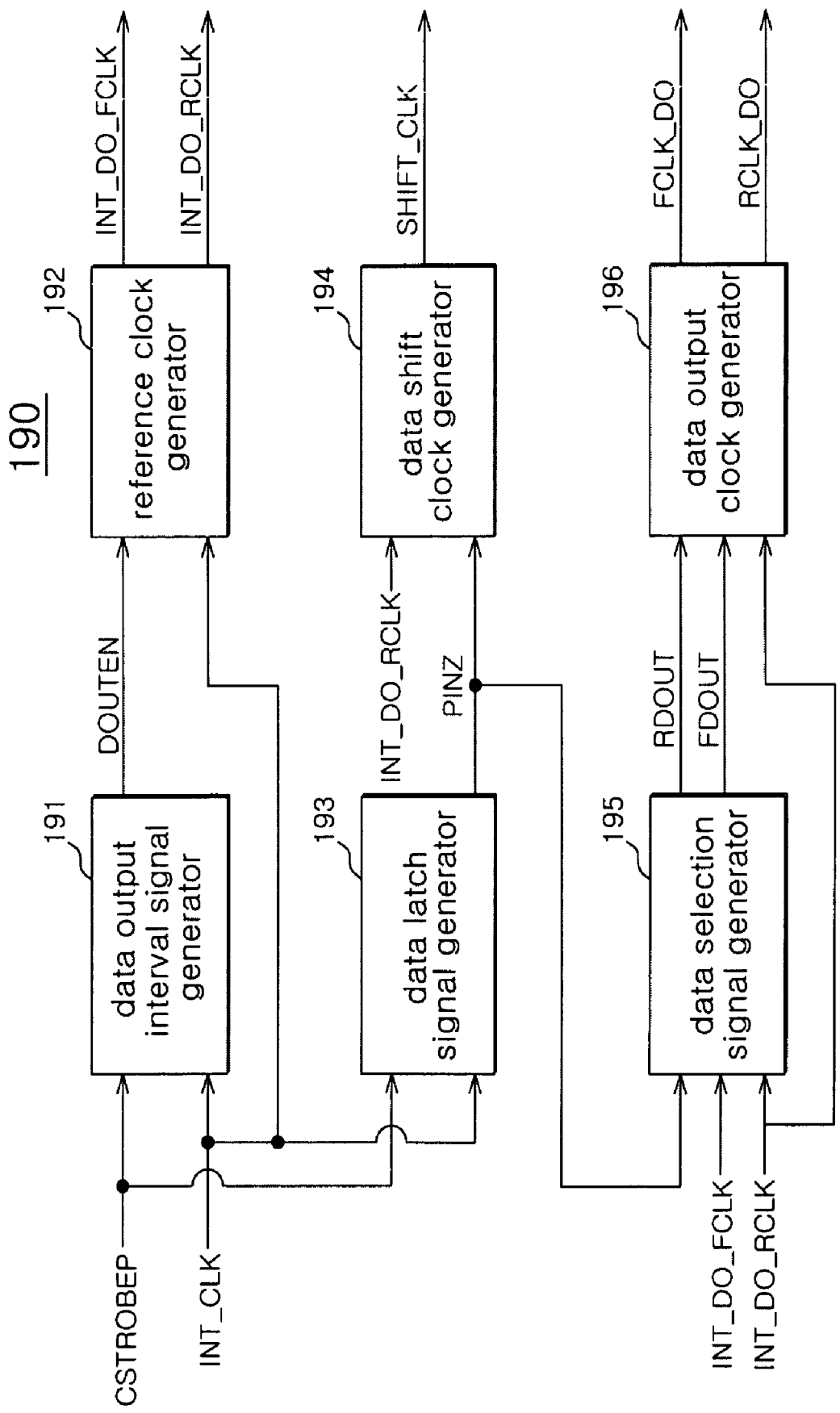
FIG. 4 is a schematic block diagram of an exemplary read controller capable of being implemented in the device of FIG. 2 according to one embodiment.

FIG. 4 is a schematic block diagram of an exemplary read controller capable of being implemented in the device of FIG. 2 according to one embodiment. In FIG. 4, the read controller 190 can be configured to include a data output interval signal generator 191, a reference clock generator 192, a data latch signal generator 193, a data shift clock generator 194, a data selection signal generator 195, and a data output clock generator 196.

The data output interval signal generator 191 can be configured to generate a data output interval signal 'DOUTEN' by using the core strobe signal 'CSTROBEP' and the internal clock signal 'INT_CLK'.

The reference clock generator 192 can be configured to generate reference clock signals 'INT_DO_RCLK' and 'INT_DO_FCLK' by using the data output interval signal 'DOUTEN' and the internal clock signal 'INT_CLK'.

The data latch signal generator 193 can be configured to generate the data latch signal 'PINZ' by using the core strobe signal 'CSTROBEP' and the internal clock signal 'INT_CLK'.

The data shift clock generator 194 can be configured to generate the data shift clock signal 'SHIFT_CLK' by using a first reference clock signal 'INT_DO_RCLK' and the data latch signal 'PINZ'.

The data selection signal generator 195 can be configured to generate the data selection signals 'RDOUT' and 'FDOUT' by using the data latch signal 'PINZ' and the reference clock signals 'INT_DO_RCLK' and 'INT_DO_FCLK'.

The data output clock generator 196 can be configured to generate the data output clock signals 'RCLK_DO' and 'FCLK_DO' by using the first reference clock signal 'INT_DO_RCLK' and the data selection signals 'RDOUT' and 'FDOUT'.

Figure 5:
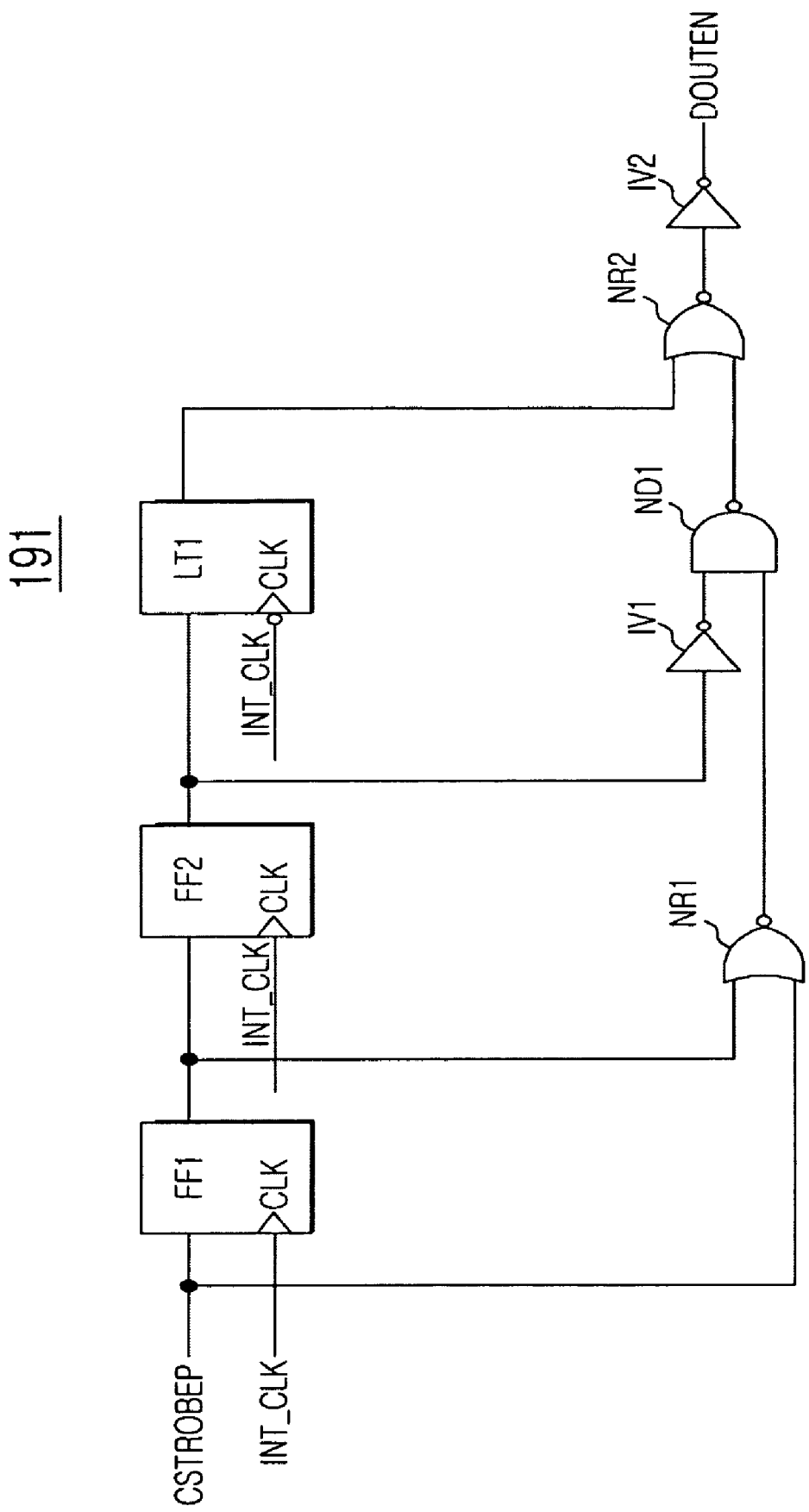
FIG. 5 is a schematic circuit diagram of an exemplary data output interval signal generator capable of being implemented in the controller of FIG. 4 according to one embodiment.

FIG. 5 is a schematic circuit diagram of an exemplary data output interval signal generator capable of being implemented in the controller of FIG. 4 according to one embodiment. In FIG. 5, a data output interval signal generator 191 can be configured to generate the data output interval signal 'DOUTEN', which can have a predetermined enable interval, by combining the core strobe signals 'CSTOBEP' sequentially shifted with use of the internal clock signal 'INT_CLK'. For example, the data output interval signal generator 191 can include first and second flip-flops FF1 and FF2, a first latch LT1, first and second inverters IV1 and IV2, a NAND gate ND1, and first and second NOR gates NR1 and NR2.

When the core strobe signal 'CSTOBEP' is enabled, the NAND gate ND1 can output a signal having a high level so that the data output interval signal 'DOUTEN' can begin to be enabled. When the core strobe signal 'CSTOBEP' is sequentially latched through the first and second flip-flops FF1 and FF2 and the first latch LT1, and when an output of the first latch LT1 is lowered to a low level, an enablement of the data output interval signal 'DOUTEN' can cease.

Figure 6:
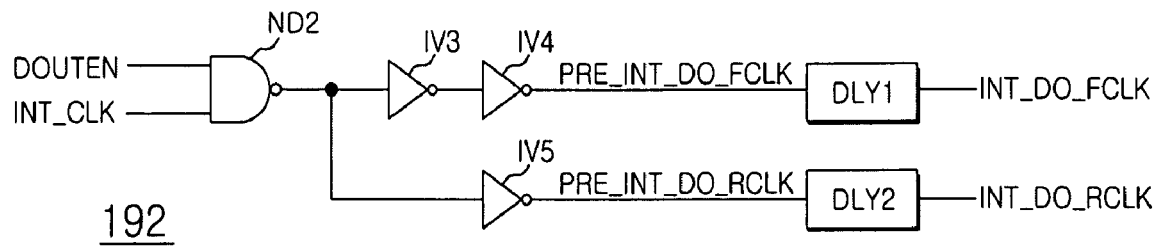
FIG. 6 is a schematic circuit diagram of an exemplary reference clock generator capable of being implemented in the controller of FIG. 4 according to one embodiment.

FIG. 6 is a schematic circuit diagram of an exemplary reference clock generator capable of being implemented in the controller of FIG. 4 according to one embodiment. In FIG. 6, a reference clock generator 192 can include a second NAND gate ND2, third to fifth inverters IV3 to IV5, a first delay device DLY1, and a second delay device DLY2.

The reference clock generator 192 can be configured to generate the first reference clock signal 'INT_DO_RCLK' by using the internal clock signal 'INT_CLK' corresponding to an enable interval of the data output interval signal 'DOUTEN'. In addition, The reference clock generator 192 can be configured to generate the second reference clock signal 'INT_DO_FCLK' by using an inverted signal of the internal clock signal 'INT_CLK' corresponding to an enable interval of the data output interval signal 'DOUTEN'.

Figure 11:
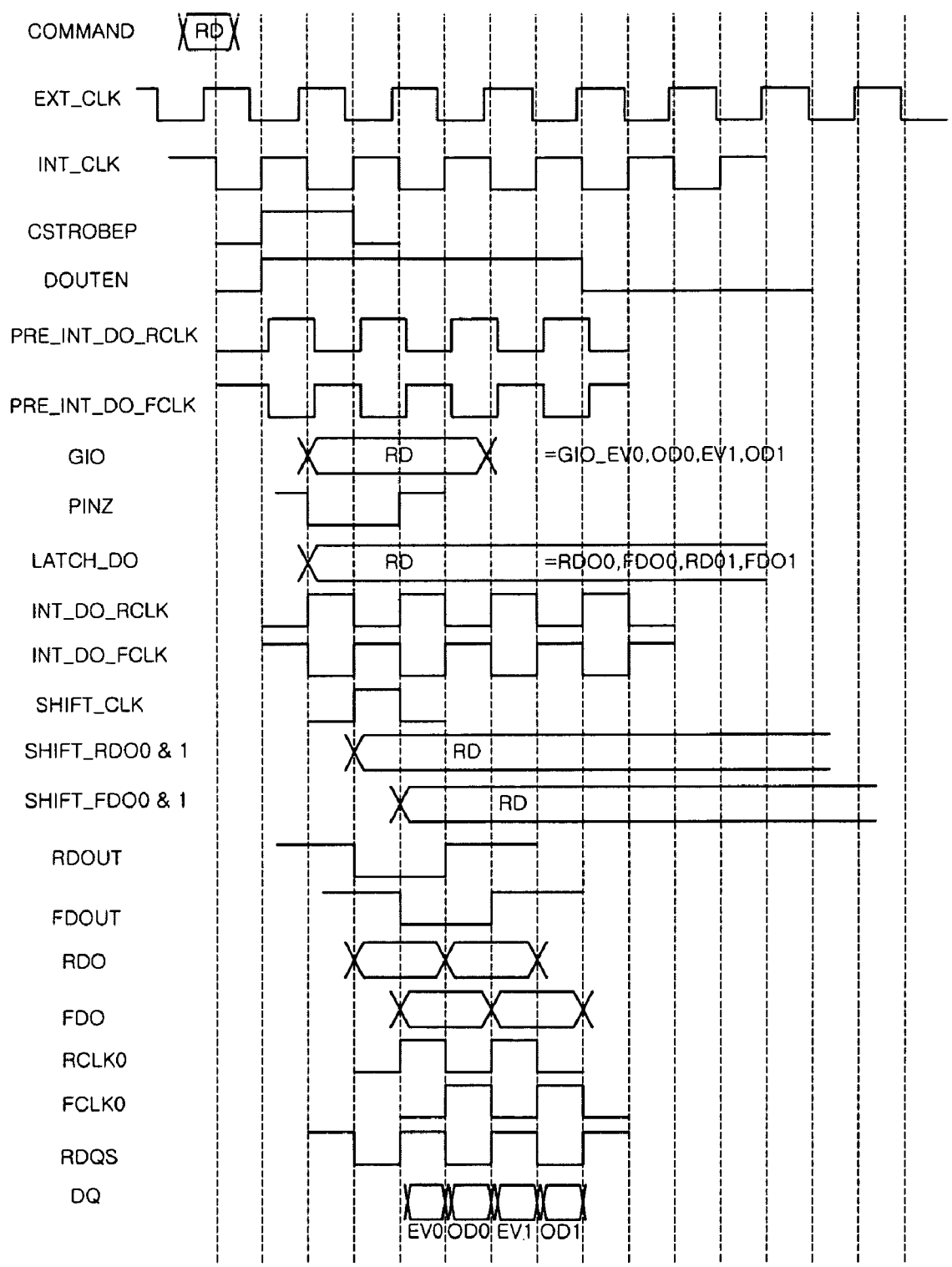
FIG. 11 is a timing diagram representing exemplary operations of a semiconductor IC device according to the one embodiment.

The first reference clock signal 'INT_DO_RCLK' and the second reference clock signal 'INT_DO_FCLK' should be synchronized with the data latch signal 'PINZ'. Accordingly, a first pre-reference clock signal 'PRE_INT_DO_RCLK' and a second pre-reference clock signal 'PRE_INT_DO_FCLK' can have a timing difference about one-half a period with reference to the data latch signal 'PINZ' and the internal clock signal 'INT_CLK'. Thus, by delaying the first pre-reference clock signal 'PRE_INT_DO_RCLK' and the second pre-reference clock signal 'PRE_INT_DO_FCLK' through the first delay device DLY1 and the second delay device DLY2, respectively, the first reference clock signal 'INT_DO_R-CLK' and the second reference clock signal 'INT_DO_F-CLK' can be synchronized with the data latch signal 'PINZ', as shown in FIG. 11.

Figure 7:
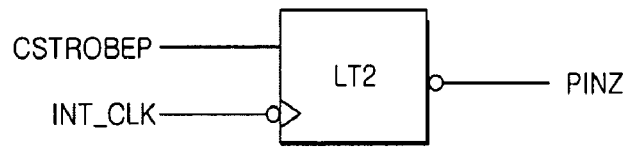
FIG. 7 is a schematic circuit diagram of an exemplary data latch signal generator capable of being implemented in the controller of FIG. 4 according to one embodiment.

FIG. 7 is a schematic circuit diagram of an exemplary data latch signal generator capable of being implemented in the controller of FIG. 4 according to one embodiment. In FIG. 7, a data latch signal generator 193 can be configured to latch the core strobe signal 'CSTOBEP' according to an inverted signal of the internal clock signal 'INT_CLK' by using a second latch LT2 to generate the data latch signal 'PINZ'.

Figure 8:
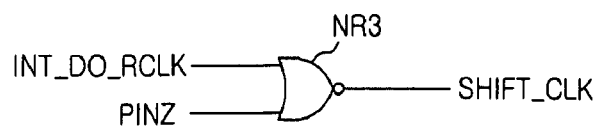
FIG. 8 is a schematic circuit diagram of an exemplary data shift clock generator capable of being implemented in the controller of FIG. 4 according to one embodiment.

FIG. 8 is a schematic circuit diagram of an exemplary data shift clock generator capable of being implemented in the controller of FIG. 4 according to one embodiment. In FIG. 8, a data shift clock generator 194 can be configured to perform a logical NOR operation on the first reference clock signal 'INT_DO_RCLK' and the data latch signal 'PINZ' by using a third NOR gate NR3 to generate the data shift clock signal 'SHIFT_CLK'.

Figure 9:
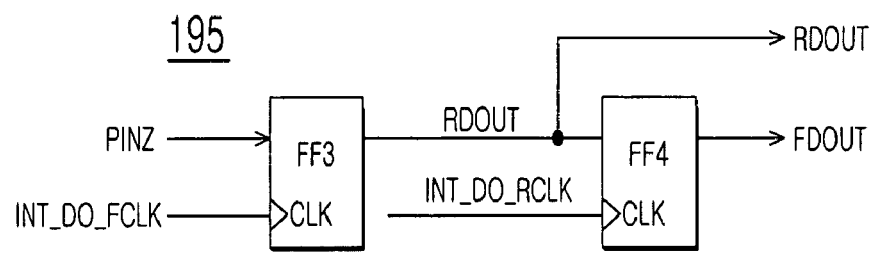
FIG. 9 is a schematic circuit diagram of an exemplary data selection signal generator capable of being implemented in the controller of FIG. 4 according to one embodiment.

FIG. 9 is a schematic circuit diagram of an exemplary data selection signal generator capable of being implemented in the controller of FIG. 4 according to one embodiment. In FIG. 9, a data selection signal generator 195 can include third and fourth flip-flops FF3 and FF4. The data selection signal generator 195 can be structured to latch the data latch signal 'PINZ' according to the second reference clock signal 'INT_DO_FCLK' to generate a first data selection signal 'RDOUT', and can be structured to latch the first data selection signal 'RDOUT' according to the first reference clock signal 'INT_DO_RCLK' to generate a second data selection signal 'FDOUT'.

Figure 10:
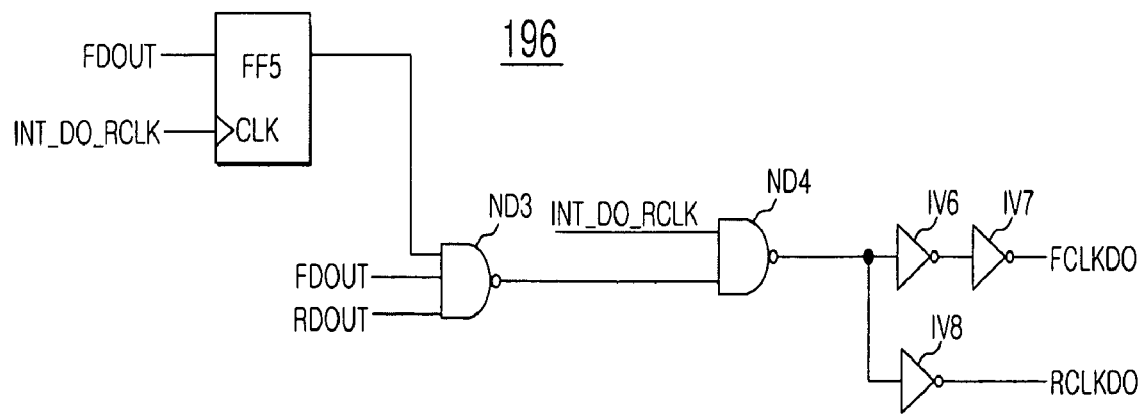
FIG. 10 is a schematic circuit diagram of an exemplary data output clock generator capable of being implemented in the controller of FIG. 4 according to one embodiment.

FIG. 10 is a schematic circuit diagram of an exemplary data output clock generator capable of being implemented in the controller of FIG. 4 according to one embodiment. In FIG. 10, a data output clock generator 196 can include a fifth flip-flop FF5, third and fourth NAND gates ND3 and ND4, and sixth to eighth inverters IV6 to IV8.

The data output clock generator 196 can generate the first data output clock signal 'RCLK_DO' by performing a logical AND operation on the first reference clock signal 'INT_DO_RCLK' and an output of a logical NAND operation on the second data selection signal 'FDOUT', the first data selection signal 'RDOUT', and the second data selection signal 'FDOUT' latched according to the first reference clock signal 'INT_DO_RCLK'. The data output clock generator 196 can invert the first data output clock signal 'RCLK_DO' to generate the second data output clock signal 'FCLK_DO'.

FIG. 11 is a timing diagram representing exemplary operations of a semiconductor IC device according to the one embodiment. In FIG. 11, an exemplary data output method of a semiconductor IC device will now be described with reference to FIGS. 2, 3, and 6-9.

The core strobe signal generator 130 can latch the read command signal 'RD' according to the internal clock signal 'INT_CLK' to generate the core strobe signal 'CSTROBEP'.

Then, the data output interval signal generator 191 can sequentially shift the core strobe signal 'CSTROBEP' according to the internal clock signal 'INT_CLK' to generate the data output interval signal 'DOUTEN'. Here, the data output interval signal 'DOUTEN' can specify an interval from the time when the core strobe signal 'CSTROBEP' is enabled to the time when data is completely output through a pad DQ.

Next, the data latch signal generator 193 can latch and invert the core strobe signal 'CSTROBEP' according to the falling edge of the internal clock signal 'INT_CLK' to generate the data latch signal 'PINZ'.

Next, the reference clock generator 192 can generate reference clock signals 'INT_DO_RCLK' and 'INT_DO_F-CLK' to be synchronized with the data latch signal 'PINZ' by using the internal clock signal 'INT_CLK' corresponding to the enable interval of the data output interval signal 'DOUTEN'.

According to the data latch signal PINZ, the plurality of latches 161-1 to 161-N can latch parallel data signals 'GIO_EV0', 'OD0', 'EV1', and 'OD1', which can be transmitted from the input/output sense amplifier IOSA 150 to a wide data line GIO. Then, the data shift clock generator 194 can perform a logical NOR operation on the first reference clock signal 'INT_DO_RCLK' and the data latch signal 'PINZ' to generate the data shift clock signal 'SHIFT_CLK'.

According to the data shift clock signal 'SHIFT_CLK', the shift unit 162 can shift latch data signals 'RDO0', 'FDO0', 'RDO1', and 'FDO1' output from the plurality of latches 161-1 to 161-N to fit data selection signals 'RDOUT' and 'FDOUT'.

Next, the data selection signal generator 195 can latch the data latch signal 'PINZ' according to the second reference clock signal 'INT_DO_FCLK' to generate the first data selection signal 'RDOUT', and can latch the first data selection signal 'RDOUT' according to the first reference clock signal 'INT_DO_RCLK' to generate the second data selection signal 'FDOUT'.

According to the data selection signals 'RDOUT' and 'FDOUT', the first multiplexing unit 163 can classify shift data signals 'SHIFT_RDO0' and 'SHIFT_RDO1' and 'SHIFT_FDO0' and 'SHIFT_FDO1' output from the shift unit 162 as even data signals 'RDO' and odd data signal 'FDO', and then output these signals.

Then, the data output clock generator 196 can generate the first data output clock signal 'RCLK_DO' by performing a logical AND operation on the first reference clock signal 'INT_DO_RCLK' and an output of a logical NAND operation on the second data selection signal 'FDOUT', the first data selection signal 'RDOUT', and the second data selection signal 'FDOUT' latched according to the first reference clock 'INT_DO_RCLK', and can invert the first data output clock signal 'RCLK_DO' to generate a second data output clock signal 'FCLK_DO'.

According to the data output clock signals 'RCLK_DO' and 'FCLK_DO', the second multiplexing unit 171 can output both the even data signal 'RDO' and the odd data signal 'FDO', which can be output from the first multiplexing unit 163, as serial data in a predetermined order, i.e., 'EV0', 'OD0', 'EV1', and 'OD1'.

Next, the serial data, i.e., 'EV0', 'OD0', 'EV1', and 'OD1', which are output from the second multiplexing unit 171, can be driven by a driver 172 to be output to a data input/output pad DQ.

As a result, a read operation of a semiconductor IC device can be performed with reference to the core strobe signal 'CSTROBEP', which is an internal signal having the fastest timing among internal signals generated responsive to an external read command, in order to output data in the fastest time after an external read command.

While certain embodiments have been described above, it will be understood that the embodiments described are by way of example only. Accordingly, the device and method described herein should not be limited based on the described embodiments. Rather, the devices and methods described herein should only be limited in light of the claims that follow when taken in conjunction with the above description and accompanying drawings.

What is claimed is:

1. A semiconductor IC device, comprising:
   an internal clock generator configured to buffer an external clock signal to generate an internal clock signal;
   a core strobe signal generator configured to latch a read command signal in response to the internal clock signal to generate a core strobe signal;
   a core block configured to output data stored in a memory cell in response to the core strobe signal;
   a data output unit configured to latch data output from the core block according to a plurality of control signals and output the latched data in a predetermined order; and
   a controller configured to generate the plurality of control signals in response to the core strobe signal and the internal clock signal,
   wherein the controller includes:
      a data output interval signal generator generating a data output interval signal in response to the core strobe signal and the internal clock;
      a reference clock generator generating reference clock signals in response to the data output interval signal and the internal clock signal;
      a data latch signal generator generating a data latch signal in response to the core strobe signal and the internal clock signal;
      a data shift clock generator generating a data shift clock signal in response to the reference clock signal and the data latch signal;
      a data selection signal generator generating data selection signals in response to the data latch signal and the reference clock signals; and
      a data output clock generator generating data output clock signals in response to the reference clock signal and the data selection signals.

2. The semiconductor IC device of claim 1, further comprises an internal clock generator for buffering an external clock signal and generating the internal clock signal.

3. The semiconductor IC device of claim 1, wherein the data output unit includes:
   a pipe latch configured to latch data output from the core block according a first group of the plurality of control signals; and
   a data selector configured to output data output from the pipe latch in the predetermined order according to a second group of the plurality of control signals excluding the first group.

4. The semiconductor IC device of claim 1, wherein the controller specifies a data output interval according to both the core strobe signal and the internal clock signal, and generates the plurality of control signals by using both the core strobe signal and the internal clock signal corresponding to the specified data output interval.

5. The semiconductor IC device of claim 1, wherein the data output interval signal generator generates the data output interval signal by combining the core strobe signals sequentially shifted with use of the internal clock signal.

6. The semiconductor IC device of claim 1, wherein the reference clock signals include a first reference clock signal and a second reference clock signal.

7. The semiconductor IC device of claim 6, wherein the reference clock generator outputs the internal clock signal corresponding to an enable interval of the data output interval signal as the first reference clock signal, and outputs a signal having a phase opposite to the internal clock signal corresponding to an enable interval of the data output interval signal as the second reference clock signal.

8. The semiconductor IC device of claim 1, wherein the data latch signal generator latches the core strobe signal according to an inverted signal of the internal clock signal to generate the data latch signal.

9. The semiconductor IC device of claim 7, wherein the data shift clock generator generates the data shift clock signal by performing a logical NOR operation on the first reference clock signal and the data latch signal.

10. The semiconductor IC device of claim 7, wherein the data selection signals include a first data selection signal and a second data selection signal, and the data selection signal generator latches the data latch signal according to the second reference clock signal to generate the first data selection signal, and latches the first data selection signal according to the first reference clock signal to generate the second data selection signal.

11. The semiconductor IC device of claim 10, wherein the data output clock signals include a first data output clock signal and a second data output clock signal, and the data output clock generator generates the first data output clock signal by performing a logical AND operation on the first reference clock signal and an output of a logical NAND operation on the second data selection signal, the first data selection signal, and the second data selection signal latched according to the first reference clock signal, and inverts the first data output clock signal to generate the second data output clock signal.

12. The semiconductor IC device of claim 1, wherein the data output unit includes:
   a pipe latch configured to latch data output from the core block according to the data latch signal, to shift the latched signal according to the data shift clock signal, and to selectively output the shifted data signal according to the data selection signals; and
   a data selector configured to select data output from the pipe latch according to the data output clock signals to output them in a predetermined order.

13. A data output method of a semiconductor IC device, the data output method comprising:
   generating an internal clock signal by buffering an external clock signal;
   generating a core strobe signal in response to a read command signal and the internal clock signal;
   generating a plurality of control signals to line up and output data stored in a memory cell in response to the core strobe signal and the internal clock signal; and
   transforming parallel data output from a memory cell to serial data in a predetermined order in response to the plurality of control signals and to output them,
   wherein the plurality of control signals includes:
      a data output interval signal specifying a data output interval;
      reference clock signals generated by using the internal clock signal corresponding to the data output interval signal;
      a data latch signal specifying a timing for latching the parallel data;
      a data shift clock shifting data stored in the pipe latch in order to synchronize data stored in the pipe latch with data selection signals and data output clock signals;
      the data section signals classifying data output from the pipe latch as even data signal and odd data signals; and the data output clock signals specifying a timing for producing both the even data signals and the odd data signals as serial data in a predetermined order.

14. The data output method of claim 13, wherein the data output interval signal is generated by combining the core strobe signals sequentially shifted with use of the internal clock signal.

15. The data output method of claim 13, wherein the reference clock signals include a first reference clock signal and a second reference clock signal, and generate the internal clock signals corresponding to an enable interval of the data output interval signal as the first reference clock signal, and generate an inverted signal of the internal clock signal corresponding to an enable interval of the data output interval signal as the second reference clock signal.

16. The data output method of claim 13, wherein the data latch signal is generated by latching the core strobe signal according to an inverted signal of the internal clock signal.

17. The data output method of claim 13, wherein the transforming the parallel data to serial data in a predetermined order and producing them, includes:
  latching the parallel data according to the data latch signal;
  shifting the latched data as much as a predetermined time according to the data shift clock signal;
  classifying the shifted data as even data signals and odd data signals according to the data selection signals; and
  producing both the even data signals and the odd data signals as serial data having a predetermined order according to the data output clock signals.

* * * * *